(12) United States Patent
Daamen et al.

(10) Patent No.: US 7,943,509 B2
(45) Date of Patent: May 17, 2011

(54) METHOD OF MAKING AN INTERCONNECT STRUCTURE

(75) Inventors: Roel Daamen, Herkenbosch (NL);
Robertus A. M. Wolters, Eindhoven (NL); Martinus P. M. Maas, Budel (NL); Pascal Bancken, Opwijk (BE); Julien M. M. Michelon, Saint Cyr Sur Loire (FR)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 12/521,982

(22) PCT Filed: Dec. 31, 2008

(86) PCT No.: PCT/IB2007/055354
§ 371 (c)(1),
(2), (4) Date: Jul. 1, 2009

(87) PCT Pub. No.: WO2008/084366
PCT Pub. Date: Jul. 17, 2008

(65) Prior Publication Data
US 2010/0029076 A1  Feb. 4, 2010

(30) Foreign Application Priority Data
Jan. 5, 2007  (EP) .................................. 07100169

(51) Int. Cl.
*H01L 21/4763* (2006.01)
(52) U.S. Cl. ........ 438/637; 438/622; 438/627; 438/628; 438/643; 438/648; 257/E21.585
(58) Field of Classification Search .................. None
See application file for complete search history.

(56) References Cited

U.S. PATENT DOCUMENTS

| | | | |
|---|---|---|---|
| 6,716,753 B1 * | 4/2004 | Shue et al. ..................... 438/687 |
| 2002/0158339 A1 | 10/2002 | Yamamoto | |
| 2003/0003719 A1 | 1/2003 | Lim et al. | |
| 2004/0232552 A1 | 11/2004 | Wang et al. | |

FOREIGN PATENT DOCUMENTS

| | | |
|---|---|---|
| EP | 1557940 A2 | 7/2005 |
| WO | 2005109490 A | 11/2005 |

OTHER PUBLICATIONS

Adams, D., et al; "Formation of Passivation and Adhesion Layers for Cu Via Nitridation of Cu-Ti in Amnonia Ambient"; Materials Chemistry and Physics, Elsevier, Switzerland; vol. 43, No. 2; Feb. 1996; pp. 145-152; XP002476293; ISSN: 0254-0584.

Ueki, M., et al; "Effects of TI Addition on Via Reliability in CU Dual Damascene Interconnects"; IEEE Transation on Electron Devices; vol. 51, Issue 11; Nov. 2004; pp. 1883-1891; http://ieeexplore.ieee.org/iel5/16/29674/01347408.pdf?tp=&arnumber=1347408&isnumber=29674.

Joswig, H., et al; "Improved Performance of TiN-Diffusion Barriers After a Posttreatment"; VLSI Multilevel Interconnection Conference 1990; IEEE; p. 477; http://ieeexplore.ieee.org/iel2/181/3586/00127935.pdf?tp=&arnumber=127935&isnumber=3586.

* cited by examiner

*Primary Examiner* — N Drew Richards
*Assistant Examiner* — Kyoung Lee

(57) ABSTRACT

A damascene process is described using a copper fill process to fill a trench (12). The copper fill (20) is started with a deposited seed layer which includes (5) copper and titanium. Some titanium migrates to the surface during the copper fill process. The structure is annealed in a nitrogen atmosphere which creates a self-aligned TiN barrier (24) at the surface of the copper fill (20). Air gaps (26) may be created in the same annealing process. The process may be used to form a multilayer structure.

8 Claims, 6 Drawing Sheets

METHOD OF MAKING AN INTERCONNECT STRUCTURE

Figure 1:
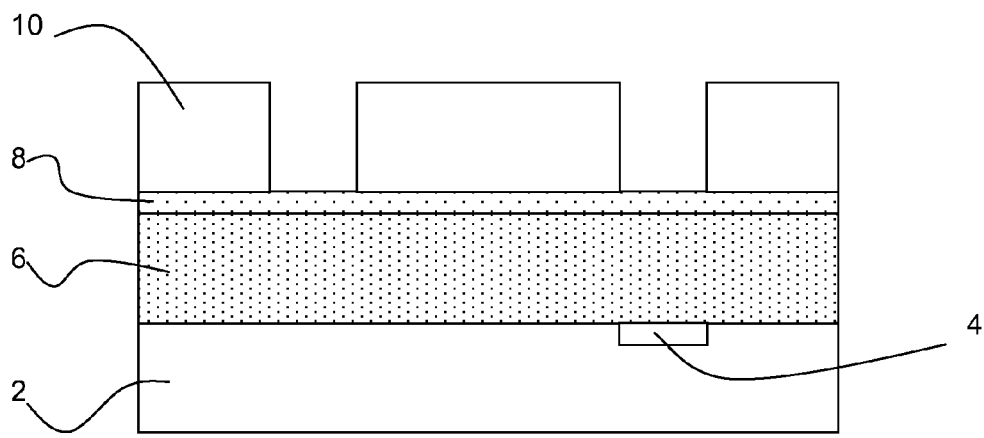

The invention relates to a method of making an interconnect structure, particularly but not exclusively a multilevel interconnect structure, and a structure formed by the method.

The feature size of integrated circuit chips has decreased steadily and with this development the performance of the chips depends increasingly on the performance of the interconnect, in particular transmission delays. Further, the increasing complexity and small size of the chips has increased the need for multi-layer interconnects.

Such interconnects may be manufactured using the so-called "damascene" process. A dielectric layer is formed, and then etched away where the interconnect is to be formed leaving a pattern of trenches. Interconnect metal is then deposited which fills the trenches but which leaves an uneven surface and excess interconnect metal on the surface. A chemical-mechanical polishing (CMP) step is then used to planarise the structure removing the excess interconnect metal on the surface and providing a suitable flat surface for further processing.

Typically, a multilayer structure is built up from alternating interconnect layers and via layers. The interconnect layers include the horizontal interconnects and the via layers provide the vertical connections between the different levels of the multiple interconnect layers and to the underlying semiconductor chip.

A single damascene process patterns each layer separately, whereas a dual damascene process patterns and fills both an interconnect layer and an underlying via layer in a single sequence of steps. The dual damascene process is more efficient and can provide a relatively low cost solution.

The transmission delays are typically determined by the resistance and capacitance of the interconnect. For this reason copper (Cu) which is a low resistance material is increasingly preferred. Copper can be combined with insulating materials with low dielectric constants, known as low-k materials, to provide interconnects with good performance.

To improve the performance still further, air gaps may be used to surround the interconnects. Since air has a dielectric constant k of 1, this can offer improved performance over interconnects surrounded by low-k dielectrics which typically have a dielectric constant k around 3. A method of manufacturing a multi-level interconnect with air gaps is taught in EP 1,577,940.

Since copper can diffuse readily through silicon and to a lesser extent silicon dioxide, a barrier layer needs to be used around the copper. Otherwise, the copper can diffuse and "kill" the transistor. Typically, a TaN/Ta or TiN barrier layer is use on the bottom and sides of the copper interconnects and a SiC(N) or SiN layer on the top of copper interconnects to avoid copper diffusion. Unfortunately, a SiC(N) or SiN layer has a relatively high dielectric constant, around 5 in the case of SiC (N). This makes a significant contribution to interconnect capacitance. A further difficulty is that copper electromigration (EM) can occur at the interface between copper and SiC(N) which decreases the lifetime of the product.

According to the invention, there is provided a method of forming a copper interconnect structure, comprising:
 (a) forming a pattern defining layer;
 (b) etching trenches in the pattern defining layer;
 (c) depositing a barrier material on the trench sidewalls;
 (d) depositing a seed layer of copper and titanium over the barrier material;
 (e) depositing copper to fill the trenches;
 (f) carrying out chemical mechanical polishing step; and
 (g) annealing the structure in nitrogen ambient to react titanium at the exposed surface of the copper with the nitrogen to form a self-aligned TiN barrier over the copper.

The nitrogen ambient should be substantially oxygen free. By forming a self-aligned TiN barrier in this way the need to form a separate SiC(N) capping layer is avoided. This reduces the number of process steps and also reduces the interconnect capacitance of the interconnections in the finished product.

Preferably the step (g) of annealing the structure in a nitrogen ambient causes the pattern defining layer to form air gaps between the copper in the trenches. In this way, the air gaps further contribute to reduced interconnect capacitance.

To achieve this, the pattern defining layer may include a porogen material with a decomposition temperature above 350° C., and the annealing step (g) may be carried out at a temperature at or above the decomposition temperature of the porogen material.

The pattern defining layer may further include a hard mask layer at its upper surface above the porogen material.

The method may be used in a multilevel interconnect structure. In embodiments, the process continues to form a via layer and a further interconnect layer, by, after the step (g) of annealing:
 (h) depositing an interlayer dielectric over the copper;
 (i) patterning the interlayer dielectric to form via holes in the interlayer dielectric;
 (j) depositing a second pattern defining layer above the interlayer dielectric filling the via holes with the material of the second pattern defining layer;
 (k) forming a mask pattern over the second pattern defining layer;
 (l) etching away the second pattern defining layer using the mask pattern as a mask to remove the material of the second pattern defining layer from the via holes and to form trenches in the second pattern defining layer;
 (m) depositing a barrier material on the sidewalls of the trenches and the sidewalls of the via holes;
 (n) depositing a seed layer of copper and titanium over the barrier material;
 (o) depositing copper to fill the trenches with interconnect layer copper and to fill the via holes with via layer copper;
 (p) carrying out a chemical mechanical polishing step; and
 (q) annealing the structure in a nitrogen ambient to react titanium at the exposed surface of the interconnect layer copper with the nitrogen to form a self-aligned TiN barrier over the interconnect layer copper.

The second pattern defining layer may be formed of a porogen material with a decomposition temperature above 350° C., and the annealing step (q) may be carried out at a temperature at or above the decomposition temperature of the porogen material to form gaps between the interconnect layer copper.

Each of the first and second pattern defining layers may include a hard mask layer at the top surface and both the hard mask layer and the interlayer dielectric may be of the same material.

In order to form further layers, steps (h) to (q) may be repeated to form at least one additional layer of a multi-layer interconnect structure.

For a better understanding of the invention, embodiments will now be described, purely by way of example, with reference to the accompanying drawings, in which FIGS. 1 to 15 show side views of a method according to the invention.

The drawings are purely schematic and not to scale. Like components are given the same reference numerals in the different Figures.

Referring to FIG. 1, a semiconductor substrate 2 is formed to have contacts 4 at its upper surface. An organic porogen material 6 is deposited over the whole surface followed by a porous oxide-like hard mask layer 8 also over the whole surface. Suitable materials for the porogen and hard mask layers are discussed below. Photoresist 10 is patterned to form a mask.

Figure 2:
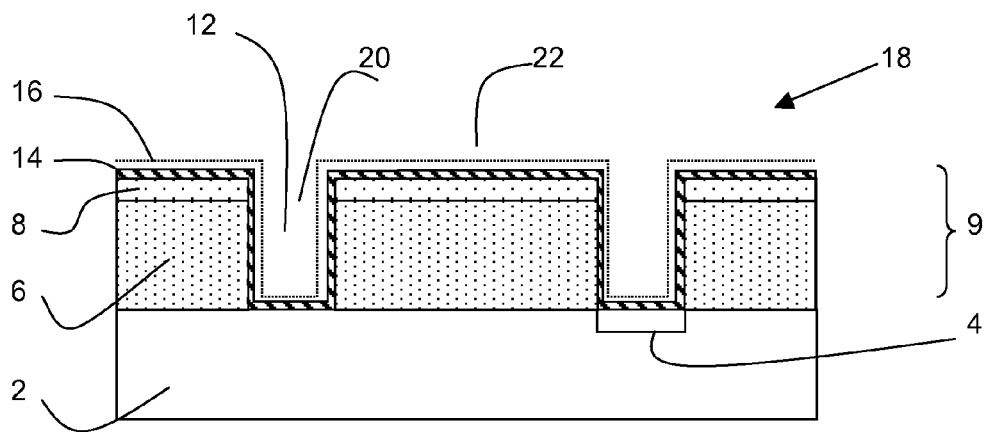

Next, as shown in FIG. 2, the porogen material 6 and hard mask layer 8 are etched together to form a pattern of trenches 12. The photoresist 10 is then removed. Since the porogen material 6 and the hard mask layer 8 together form the pattern, they will be referred to together as the pattern defining layer 9.

A barrier metal layer 14 is deposited followed by a copper-titanium seed layer 16 shown schematically. This is formed by plasma vapour deposition (PVD) using a copper-titanium target. The amount of titanium may be less than 10%, preferably about 0.5% to 5%.

Figure 3:
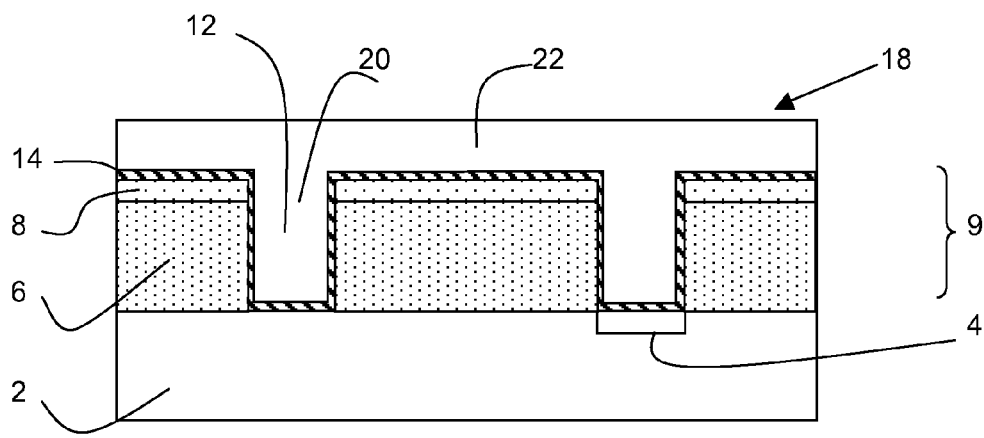

Referring to FIG. 3, bulk copper 18 is then formed in an electroplating step, filling the trenches 12 with interconnect layer copper 20 and leaving excess copper 22 on the surface.

Figure 4:
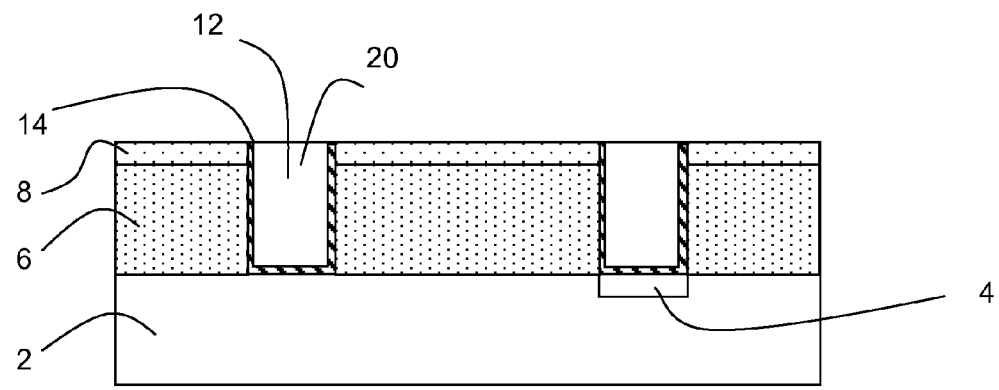

A chemical mechanical deposition step removes the excess copper 22 and can if required partially remove the hard mask layer 8, leaving to the structure shown in FIG. 4.

Next, the structure is annealed in a nitrogen atmosphere at a temperature of around 400° C. or more. The titanium of the seed layer 16 diffuses through the deposited copper 18 and some arrives at the upper surface of the interconnect layer copper where it forms a titanium nitride self aligned passivation layer 24 by reaction with the nitrogen of the ambient. The higher the annealing temperature the faster the diffusion.

Figure 5:
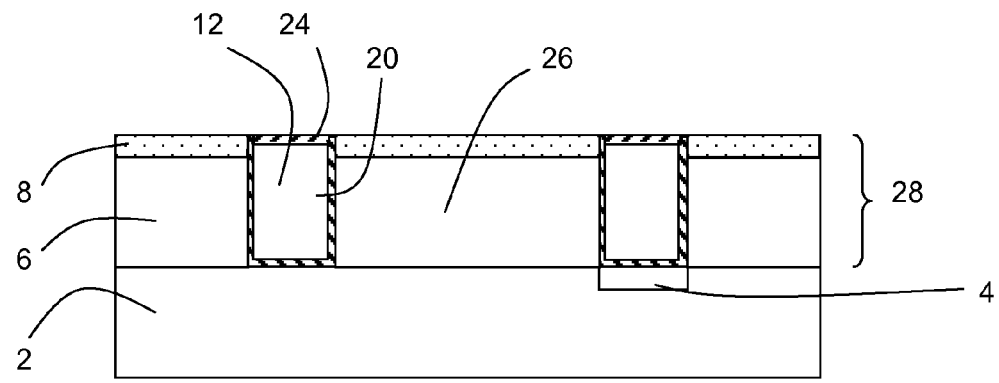

Further, the same annealing step causes decomposition of the porogen material 6 leaving an air gap 26 with the hard mask layer 8 as illustrated in FIG. 5. This finishes the lowest interconnect layer 28.

Figure 9:
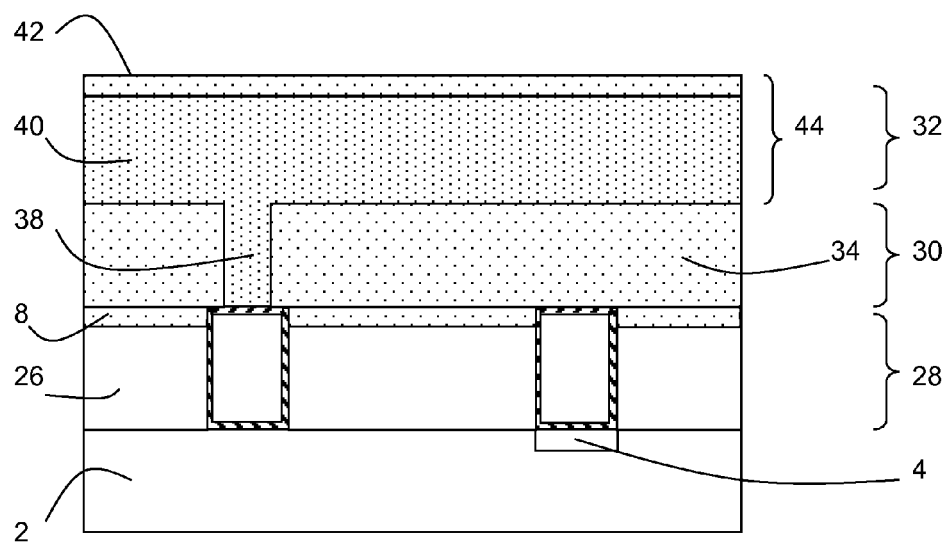
Figure 10:
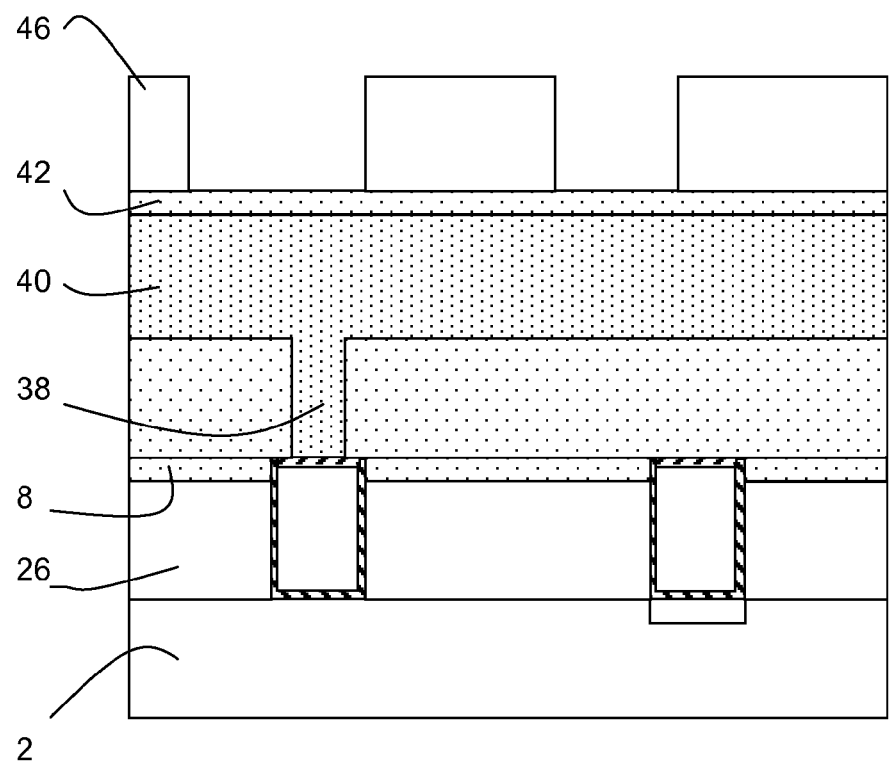

The process continues using a dual damascene process to form a via layer 30 and a further interconnect layer 32 (FIG. 9).

Figure 6:
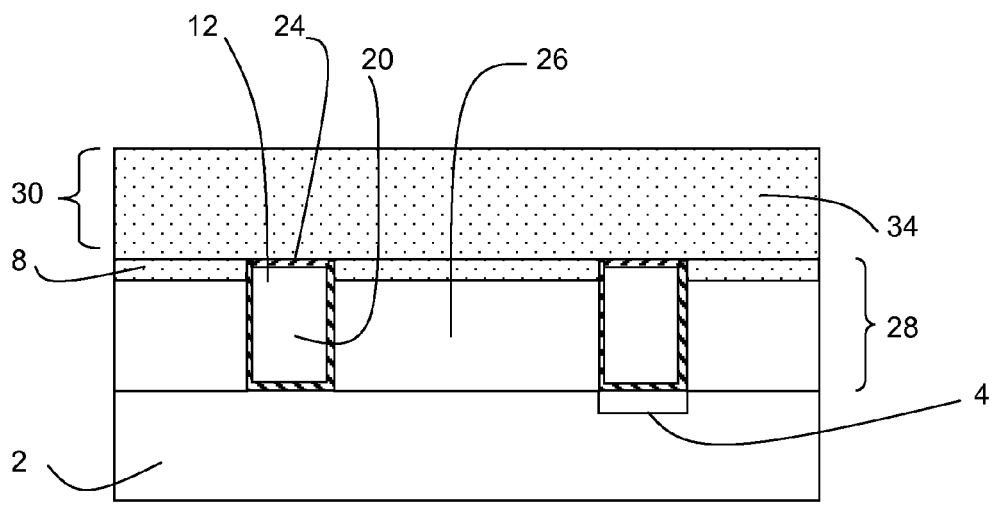
Figure 7:
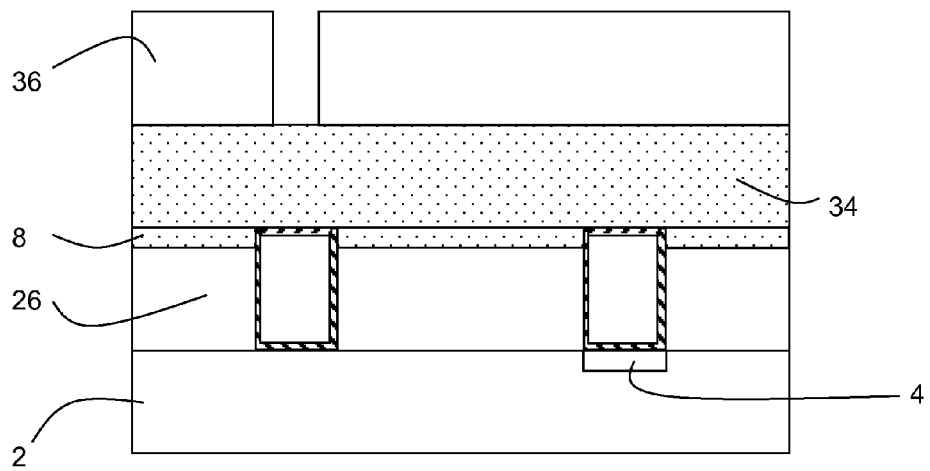
Figure 8:
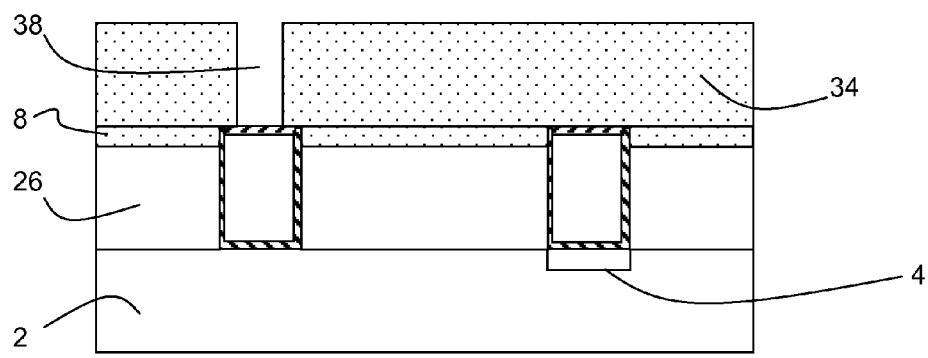

Firstly, an interlevel dielectric material layer 34 is formed that will be used to form the via layer 30, as illustrated in FIG. 6. Photoresist is deposited and used to form a mask pattern 36 (FIG. 7). This is then used to etch via holes 38 in the interlevel dielectric material layer 34, as shown in FIG. 8.

Porogen material is then deposited, filling the via holes 38 and providing porogen material layer 40 above the interlevel dielectric material layer 34. A hard mask layer 42 is then deposited above the porogen material layer 40 as shown in FIG. 9. The hard mask layer 42 and porogen material layer 40 together make up a further pattern defining layer 44 which will form the further interconnect layer 32.

Figure 11:
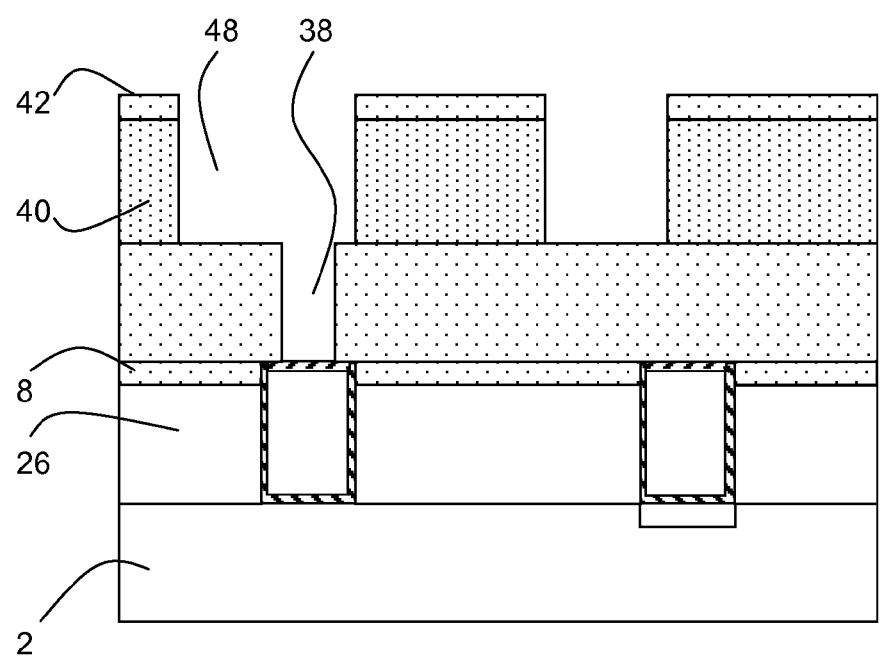

A mask pattern 46 of photoresist is formed over the pattern defining layer 44 (FIG. 10) and an etch step carried out to etch trenches 48 in the pattern defining layer 44 as well as to remove the porogen material from via holes 38 (FIG. 11). The mask pattern 46 is then removed.

Figure 12:
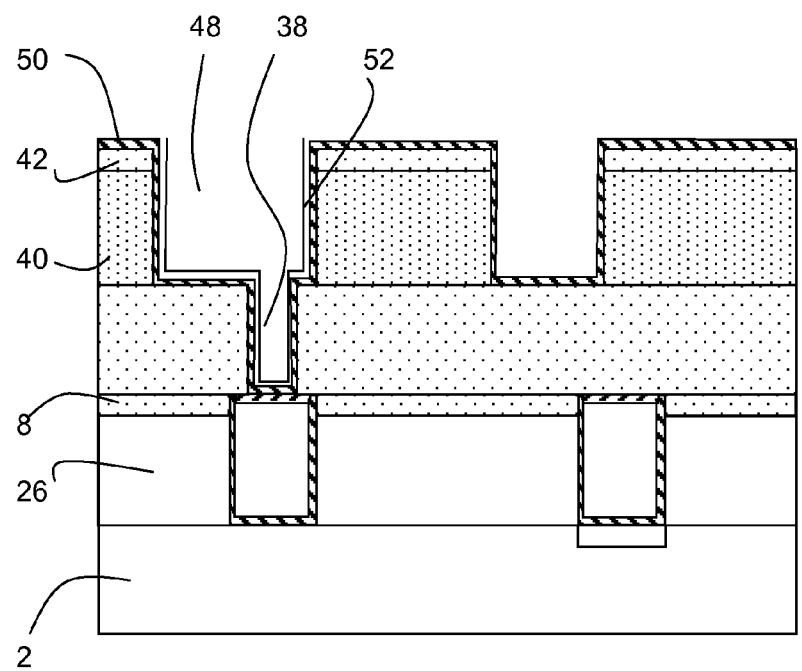

A barrier layer 50 is deposited on the side walls of the via holes 38 and trenches 48, followed by a copper-titanium seed layer 52 as before (FIG. 12).

Figure 13:
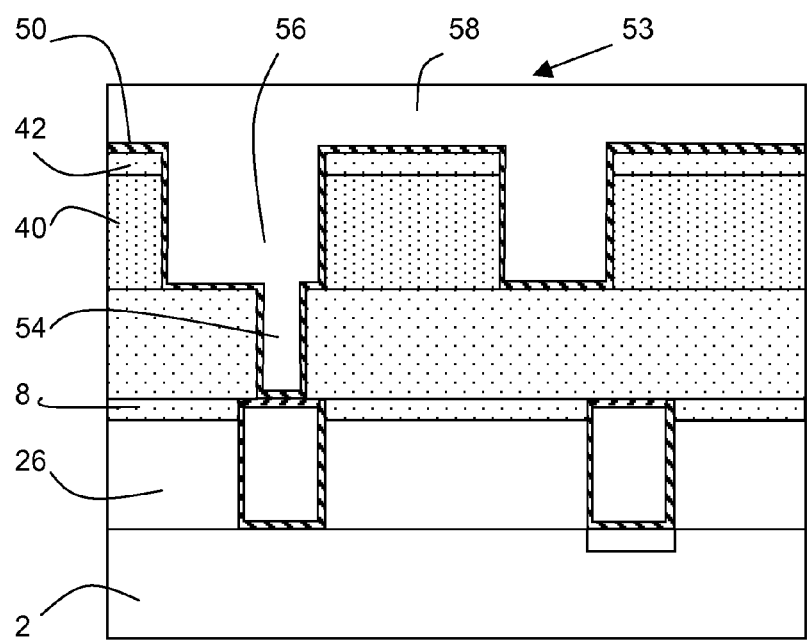
Figure 14:
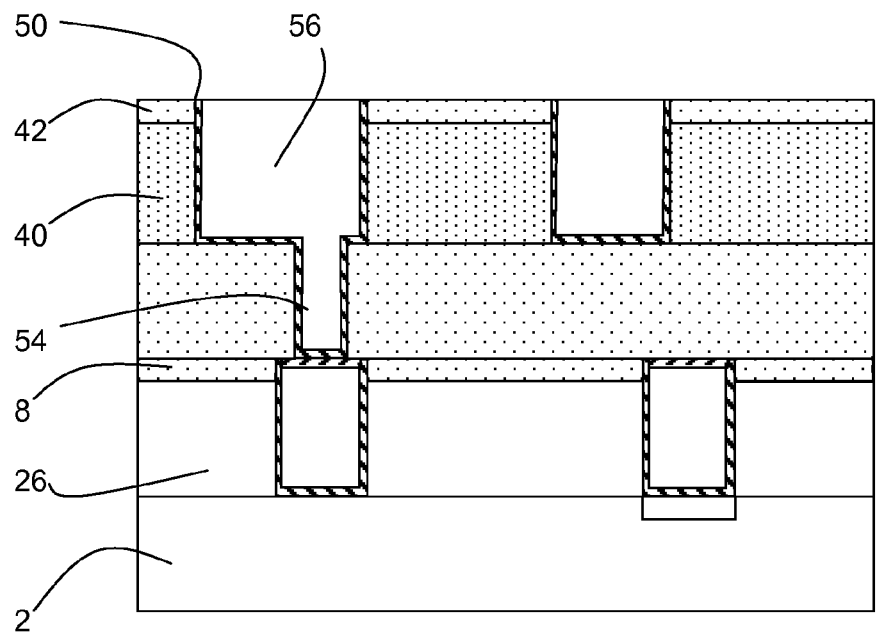

An electroplating step is then carried out to deposit copper 53. This fills the via holes 38 with via layer copper 54 and fills the trenches in the further pattern defining layer 44 with interconnect layer copper 56 as shown in FIG. 13. Excess copper 58 remains on the surface. This is removed with a chemical mechanical polishing step as shown in FIG. 14.

Figure 15:
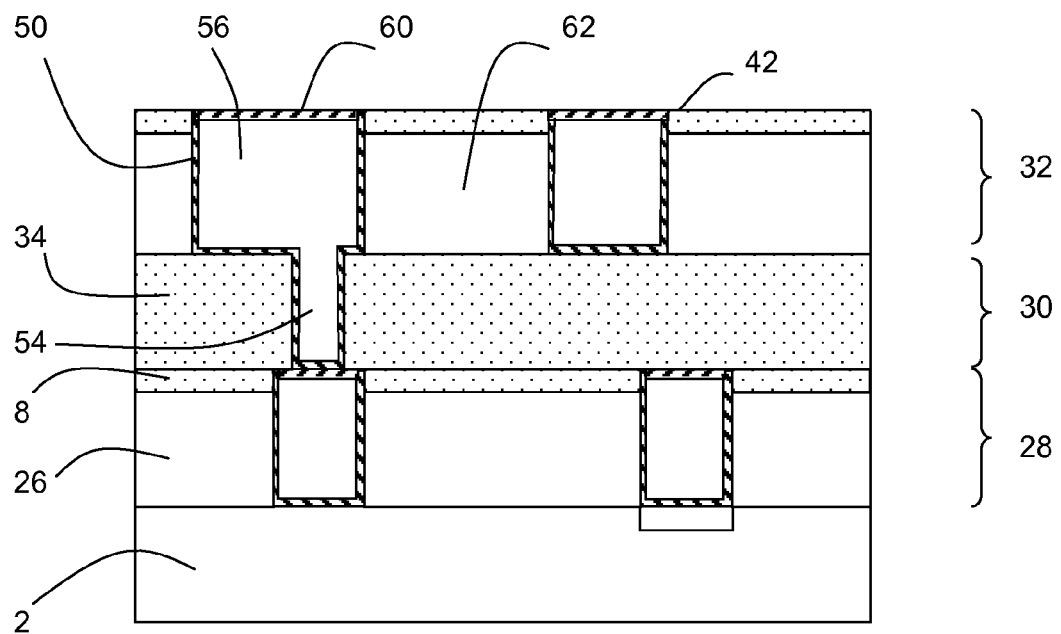

An annealing step is then carried out in a nitrogen atmosphere which forms TiN barrier layer 60 at the top of the interconnect layer copper 56 and also forms air gaps 62 by decomposition of the porogen of the porogen material layer 40, to result in the structure shown in FIG. 15 with a finished interconnect layer 28, via layer 30 and further interconnect layer 32.

The steps illustrated in FIGS. 6 to 15 can then be repeated as required to form multiple levels.

Suitable choices for the porogen material used in porogen material layers 6, 40 include polymers such as polymers of the (meth)acrylate family including resists, which may be fluorinated. Materials with a decomposition temperature above 350° C., preferably around 400° C. are preferred. Several suitable materials are available from vendors which may include Shipley XP0733™, JSRMicro TDP-C1002™ and Dow Chemical's Houdini™.

The hard mask layer 8 and interlayer dielectric material layer 34 can conveniently be formed of the same material. They should exhibit good etch-selectivity towards the porogen. Low-k materials are particularly preferred. Porous materials such as are commercially available are particularly preferred, such as the materials sold as Black Diamond™ or Aurora™.

The process of the invention decomposes the porogen in the final annealing step thereby keeping the porogen present for the rest of the processing steps. This maintains the structural integrity of the IC and avoids the need for extra or special lithography steps.

The TiN barrier layers are formed in the same annealing step as is used to form the air gaps which reduces the number of processing steps.

The method can provide a number of levels of air gaps as may be required by a chip designer.

The replacement of the conventional copper seed layer with a copper-titanium seed layer makes introduction into a manufacturing environment much easier.

A particular benefit of the method according to the invention is the avoidance of a need to form a standard SiC(N) capping layer at the location of the TiN barrier layers of the present invention, which can greatly reduce total capacitance and hence improve interconnect speeds.

The invention can be applied wherever multilevel interconnect schemes are required and can easily be adapted into existing semiconductor process flows.

The invention claimed is:

1. A method of forming a copper interconnect structure, comprising:
   (a) forming a pattern defining layer;
   (b) etching trenches in the pattern defining layer;
   (c) depositing a barrier material on the trench sidewalls;
   (d) depositing a seed layer of copper and titanium over the barrier material;
   (e) depositing copper to fill the trenches;
   (f) carrying out a chemical mechanical polishing step; and
   (g) annealing the structure in a nitrogen ambient to react titanium at the exposed surface of the copper with the nitrogen to form a self-aligned TiN barrier over the copper;

wherein the annealing in the nitrogen ambient causes the pattern defining layer to form air gaps between the copper in the trenches.

2. A method according to claim 1 wherein the pattern defining layer includes a porogen material with a decomposition temperature above 350° C., and wherein the annealing step (g) is carried out at a temperature at or above the decomposition temperature of the porogen material.

3. A method according to claim 2 wherein the pattern defining layer includes a hard mask layer at its upper surface above the porogen material.

4. A method according to claim 1, further comprising, after the step (g) of annealing:
- (h) depositing an interlayer dielectric;
- (i) patterning the interlayer dielectric to form via holes in the interlayer dielectric;
- (j) depositing a second pattern defining layer above the interlayer dielectric filling the via holes with the material of the second pattern defining layer;
- (k) forming a mask pattern over the second pattern defining layer;
- (l) etching away the second pattern defining layer using the mask pattern as a mask to remove the material of the second pattern defining layer from the via holes and to form trenches in the second pattern defining layer;
- (m) depositing a barrier material on the sidewalls of the trenches and the sidewalls of the via holes;
- (n) depositing a seed layer of copper and titanium over the barrier material;
- (o) depositing copper to fill the trenches with interconnect layer copper and to fill the via holes with via layer copper;
- (p) carrying out a chemical mechanical polishing step; and
- (q) annealing the structure in a nitrogen ambient to react titanium at the exposed surface of the interconnect layer copper with the nitrogen to form a self-aligned TiN barrier over the interconnect layer copper.

5. A method according to claim 4 wherein the second pattern defining layer is formed of a porogen material with a decomposition temperature above 350° C., and wherein the annealing step (q) is carried out at a temperature at or above the decomposition temperature of the porogen material to form air gaps between the interconnect layer copper.

6. A method according to claim 4 wherein each of the first and second pattern defining layers include a hard mask layer at the top surface and both the hard mask layers and the interlayer dielectric are of the same material.

7. A method according to claim 4, including repeating the steps (h) to (q) to form at least one additional layer of a multi-layer interconnect structure.

8. A method according to claim 2 wherein the hard mask layer is of low-k dielectric with a dielectric constant below 3.

* * * * *